US009756230B2

(12) United States Patent
Amano et al.

(10) Patent No.: US 9,756,230 B2
(45) Date of Patent: Sep. 5, 2017

(54) MOUNTING AND INSPECTION DATA CREATION DEVICE AND MOUNTING AND INSPECTION DATA CREATION METHOD

(75) Inventors: Masafumi Amano, Chiryu (JP); Mikio Nakajima, Chiryu (JP); Kenji Sugiyama, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 256 days.

(21) Appl. No.: 14/400,093

(22) PCT Filed: May 10, 2012

(86) PCT No.: PCT/JP2012/062060
§ 371 (c)(1),
(2), (4) Date: Nov. 14, 2014

(87) PCT Pub. No.: WO2013/168277
PCT Pub. Date: Nov. 14, 2013

(65) Prior Publication Data
US 2015/0146005 A1    May 28, 2015

(51) Int. Cl.
*H05K 13/08*    (2006.01)
*G06T 7/70*    (2017.01)
(Continued)

(52) U.S. Cl.
CPC ....... *H04N 5/2254* (2013.01); *G06K 9/00664* (2013.01); *H04N 7/181* (2013.01); *H05K 13/08* (2013.01); *H04N 2005/2255* (2013.01)

(58) Field of Classification Search
CPC ....... G06K 9/00664; H04N 2005/2255; H04N 5/2254; H04N 7/181; H05K 13/08
(Continued)

(56) References Cited

U.S. PATENT DOCUMENTS 5,457,538 A *  10/1995  Ujiie ................. H05K 13/0413
                                                          348/87
7,006,211 B1 *  2/2006  Belew ...................... H02G 1/04
                                                          174/60
(Continued)

FOREIGN PATENT DOCUMENTS

JP          9-307292       11/1997
JP       2007-184589        7/2007
(Continued)

OTHER PUBLICATIONS

International Search Report issued Jun. 26, 2012 in PCT/JP12/062060 filed May 10, 2012.
(Continued)

*Primary Examiner* — Jamie Atala
*Assistant Examiner* — James Boylan
(74) *Attorney, Agent, or Firm* — Oblon, McClelland, Maier & Neustadt, L.L.P.

(57)    ABSTRACT

A number one camera and number two camera are provided in the top section and lower section of a mounting and inspection data creation device. A number one lighting device and top side shielding plate are provided on the lower side of a lens of number one camera. A number two lighting device and lower side shielding plate are provided on the top side of a lens of number two camera. Component is set on transparent setting plate that is positioned between top side shielding plate and lower side shielding plate, and when imaging the top side (pickup side) of component with number one camera, top side shielding plate is slid out of the imaging area of number one camera. When imaging the bottom side (mounting side) of component with number two camera, lower side shielding plate is slid out of the imaging area of number two camera. Mounting data is created based on component bottom side image taken by number two
(Continued)

camera, and inspection data is created based on component top side image taken by number one camera.

5 Claims, 4 Drawing Sheets

(51) Int. Cl.
    *H04N 5/225*     (2006.01)
    *G06K 9/00*     (2006.01)
    *H04N 7/18*     (2006.01)

(58) Field of Classification Search
    USPC ......................................................... 348/159
    See application file for complete search history.

(56) References Cited

U.S. PATENT DOCUMENTS

| | | | | |
|---|---|---|---|---|
| 2004/0156539 | A1* | 8/2004 | Jansson | G01N 21/8903 382/145 |
| 2006/0098190 | A1* | 5/2006 | Miyake | G01N 21/896 356/239.1 |
| 2010/0132187 | A1* | 6/2010 | Nishino | H01L 24/75 29/739 |
| 2010/0229377 | A1* | 9/2010 | Jindo | H04N 5/2355 29/709 |
| 2011/0025354 | A1* | 2/2011 | Shimotomai | G01N 21/9501 324/750.03 |
| 2011/0243431 | A1* | 10/2011 | Sangappa | G06K 9/00228 382/164 |

FOREIGN PATENT DOCUMENTS

| | | |
|---|---|---|
| JP | 2007-294622 | 11/2007 |
| JP | 2008-211009 | 9/2008 |
| JP | 2008-283050 | 11/2008 |
| WO | 2009-025016 | 2/2009 |

OTHER PUBLICATIONS

Extended European Search Report issued Jun. 30, 2015 in Patent Application No. 12876387.7.

* cited by examiner

[Fig.1]
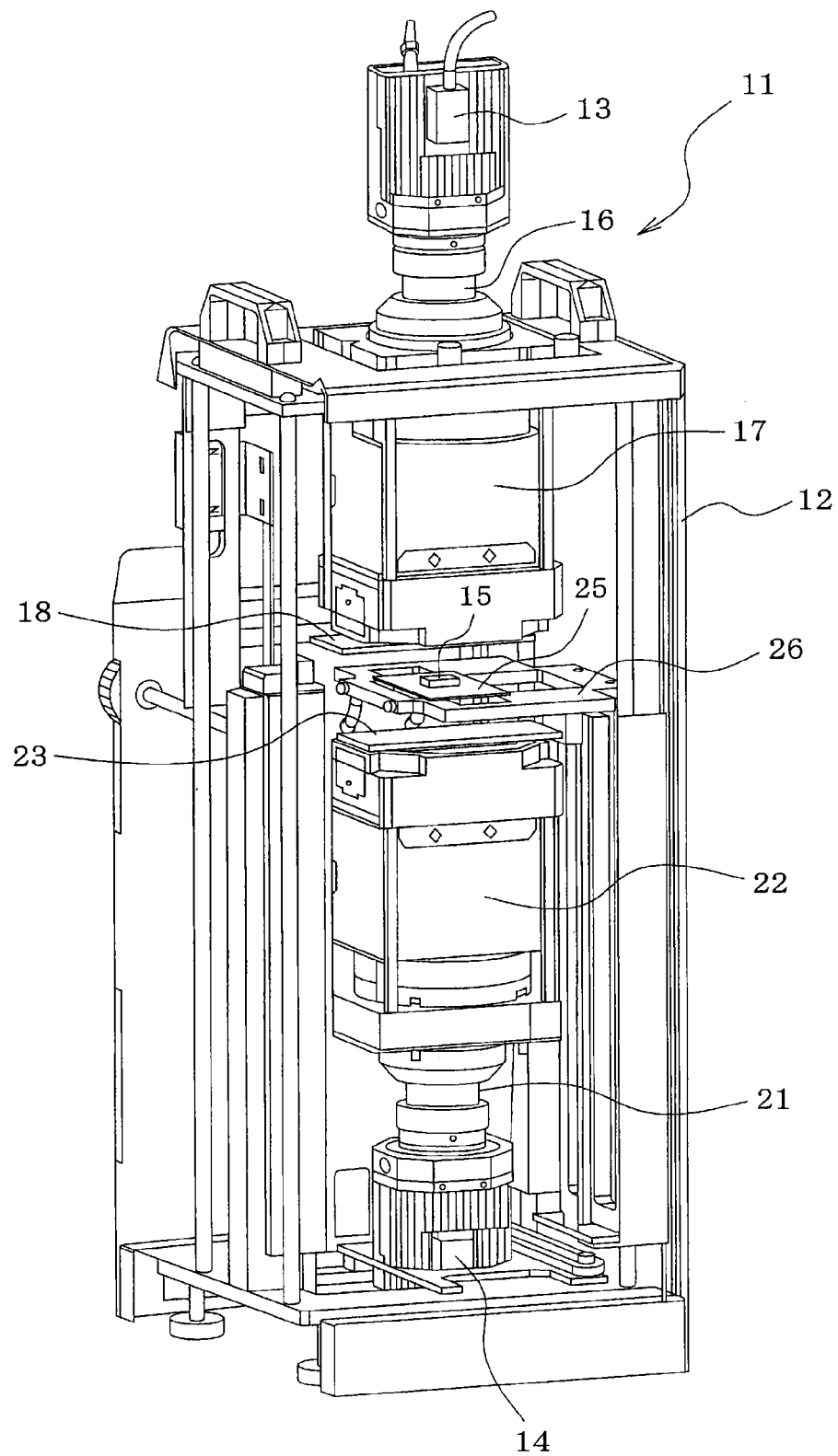

[Fig.2]
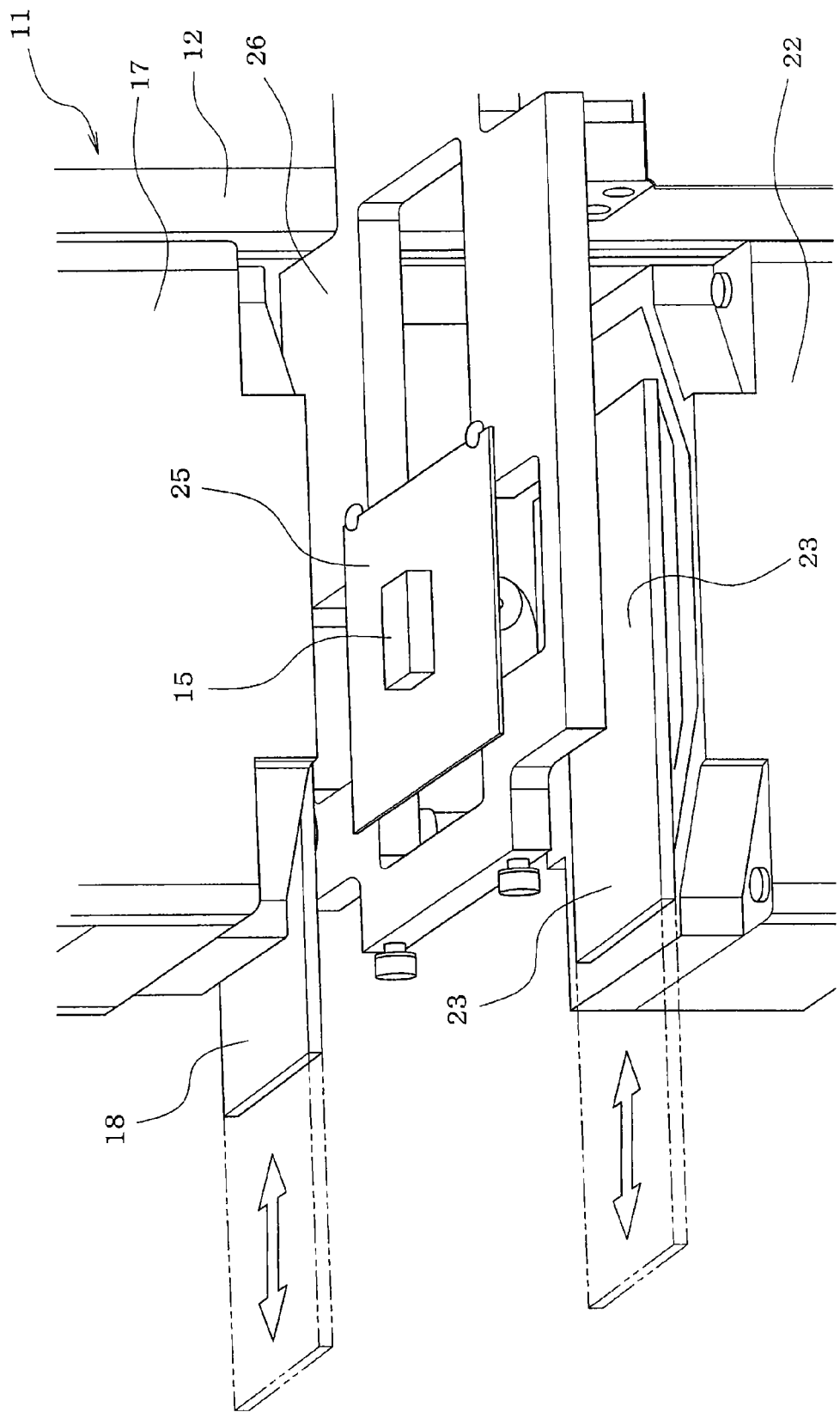

[Fig.3]
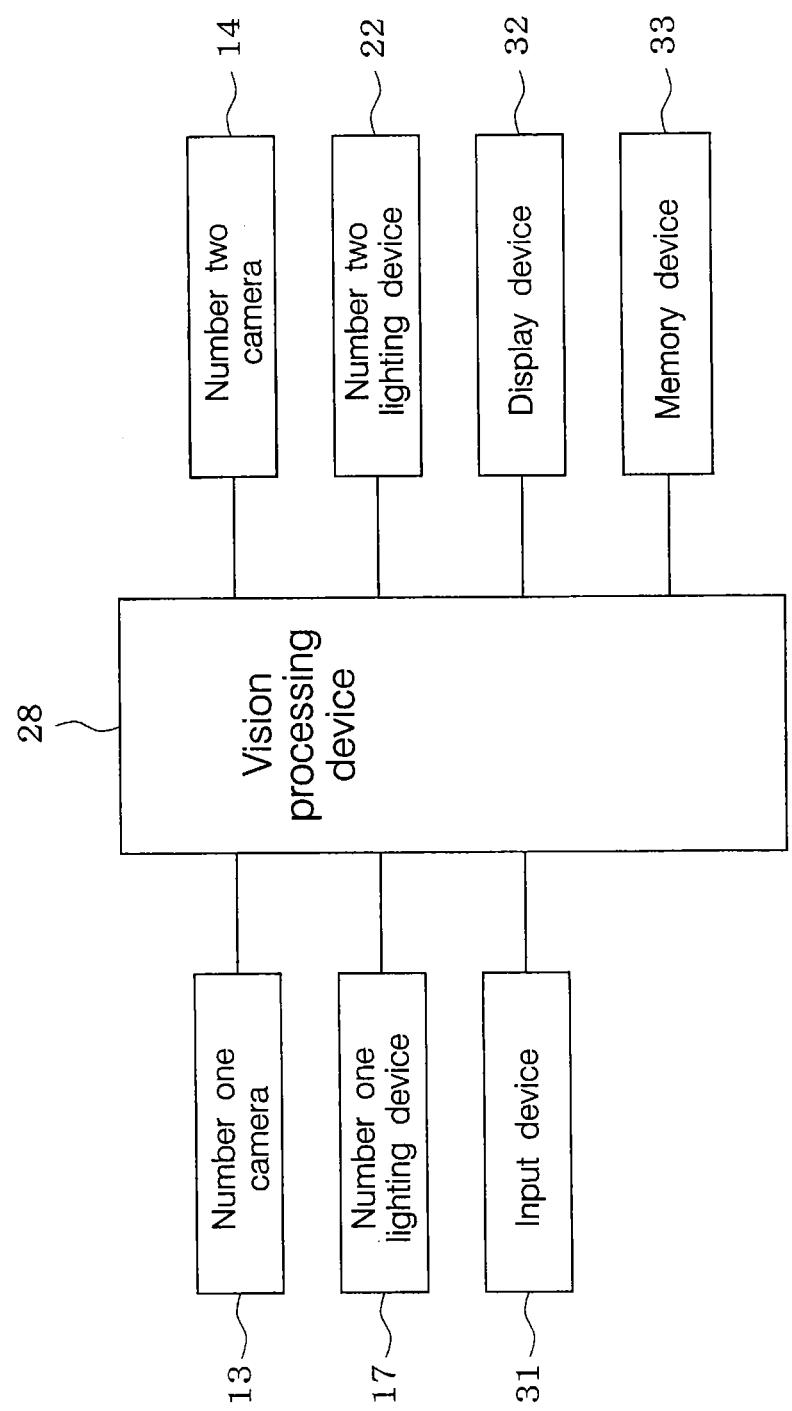

[Fig.4]
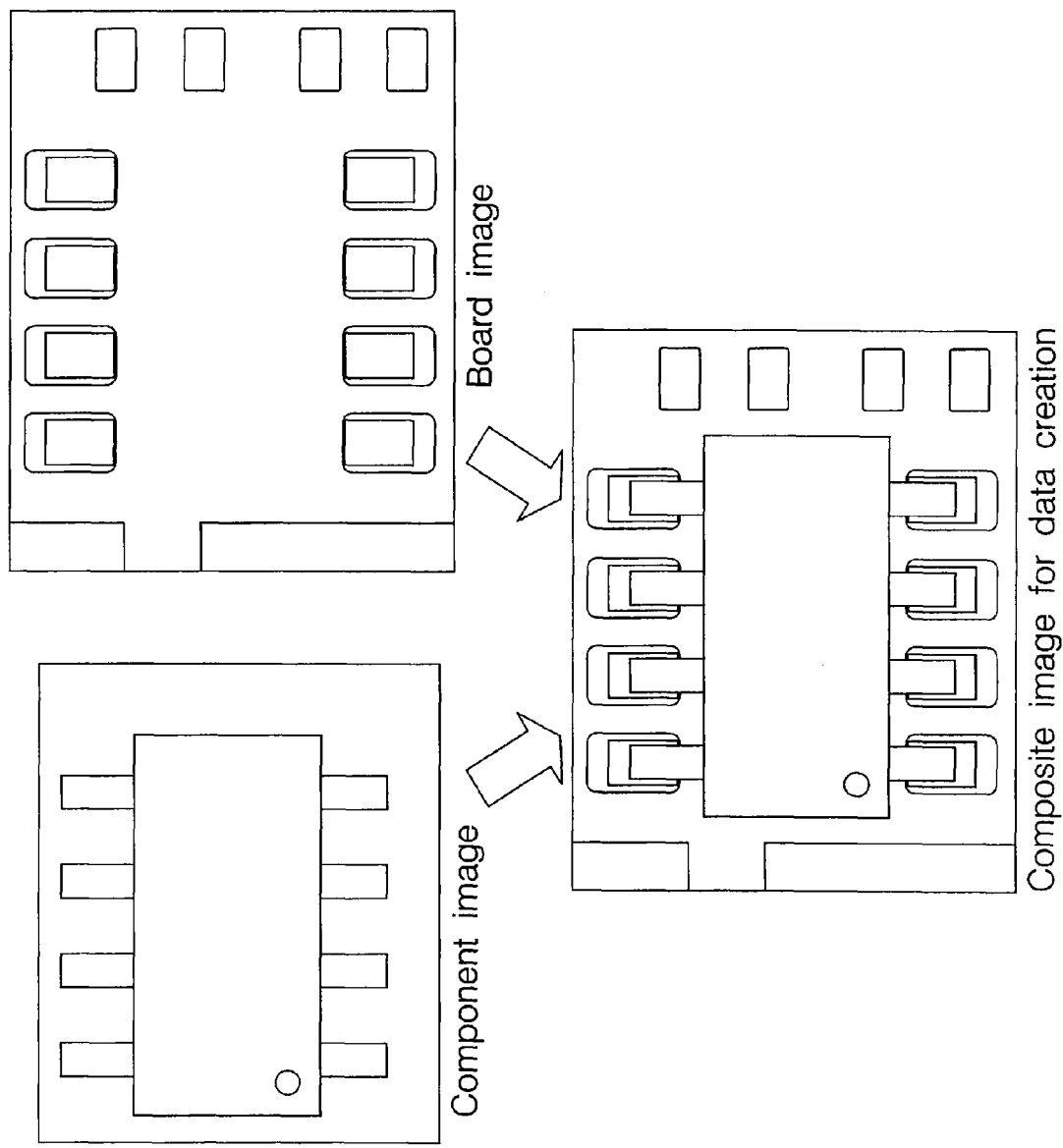

MOUNTING AND INSPECTION DATA CREATION DEVICE AND MOUNTING AND INSPECTION DATA CREATION METHOD

TECHNICAL FIELD

The present disclosure relates to a mounting and inspection data creation device and mounting and inspection data creation method for creating mounting data used by a vision processing device of a component mounter and inspection data used by a vision processing device of an inspection machine.

BACKGROUND ART

For component mounters which mount components supplied by a component supply device on boards, and inspection machines which inspect the component mounting condition on the board, there are vision processing techniques performed to recognize components and inspect the component mounting condition. For example, for component mounters, mounting data (so-called component data) used as the judgment criteria when identifying a component being held on a suction nozzle is required. In addition, for inspection machines, inspection data used as the judgment criteria when inspecting the mounting condition of components on boards is required.

Conventionally, mounting data and inspection data are created at separate data creation devices. For example, with a mounting data creation device disclosed in patent literature 1 (Japanese Unexamined Patent Application Publication Number 2008-283050), an image of the component used for creating mounting data is captured with a camera and mounting data is created based on that image.

On the other hand, with an inspection data creation device disclosed in patent literature 2 (Japanese Unexamined Patent Application Publication Number 2007-184589), an image of the board used for creating inspection data is captured with a camera and inspection data is created based on that image.

CITATION LIST

Patent Literature

Patent Literature 1: Japanese Unexamined Patent Application Publication Number 2008-283050
Patent Literature 2: Japanese Unexamined Patent Application Publication Number 2007-184589

SUMMARY OF INVENTION

Problem to be Solved by the Invention

Generally, at a component mounter, because image recognition is performed by taking an image of a component being held on a suction nozzle with a camera from below (the mounting side), it is desirable to create mounting data based on an image taken of the bottom of the component.

In contrast, at an inspection machine, because recognition is performed by taking an image of components mounted on boards with a camera from above (the pickup side), it is desirable to create inspection data based on an image taken of the top of the component. In this case, for components for which the image of the bottom of the component matches the image of the top of the component, there are cases in which there are no problems if the inspection data is created using the image of the bottom of the component. However, for components for which the image of the bottom of the component is different from the image of the top of the component, there are cases in which inspection cannot be performed sufficiently if inspection data is created using an image of the bottom of the component.

In addition, if the mounting data and inspection data are created by separate data creation devices, not only is the work efficiency bad, there are also cases of deviations in the part positions in the captured images between the two data creation devices, mistakes in component directionality (polarity), and operation mistakes such as mistakenly taking the wrong component image. Thus, it is possible that incorrect data will be created.

Therefore, the object of the present disclosure is directed to a mounting and inspection data creation device and mounting and inspection data creation method which achieve improved operation efficiency and improved reliability and accuracy of mounting and inspection data wherein both mounting data and inspection data can be created at a single data creation device.

Means for Solving the Problem

To solve the above problem, the present disclosure is directed to a mounting and inspection data creation device and mounting and inspection data creation method for creating mounting data used by a vision processing device of a component mounter which picks up components supplied by a component supply device using suction nozzles and mounts them on a board, and for creating inspection data used by a vision processing device of an inspection machine to inspect the components mounted on the board, wherein a component which is the target for data creation is set with a component settings means in which it is possible to image both the pickup side and mounting side, images of the pickup side and mounting side of the component are taken by respective imaging devices, and the mounting data is created based on the image of the mounting side of the component, and the inspection data is created based on the image of the pickup side of the component. By this, mounting data and inspection data can both be created efficiently by a single mounting and inspection data creation device.

Further, because the component which is the target for data creation is set in a condition in which it is possible to image both the pickup side and mounting side, the component does not have to be moved between taking images of the pickup side and mounting side of the component, and it is possible to eliminate operation mistakes such as component position deviations between the two images, component direction (polarity) mistakes, and imaging the wrong component. By this, creating incorrect data can be prevented, and the reliability and accuracy of the mounting and inspection data can be improved.

Incidentally, when creating mounting data and inspection data from each image of the component mounting side and pickup side, there are cases when the component center position is specified for each image. In this case, if there is a deviation in the part center for the two images, component deviation inspection cannot be performed accurately.

For this point, with this disclosure, because images can be taken without moving the component between taking images of the mounting side of the component and taking images of the pickup side, it is possible to set the same coordinates for the component center in the image for the mounting side of the component and the image for the pickup side of the component. By this, if the component center position is specified in one image, the component center position in the other image is automatically determined, and it is possible to create accurate mounting data and inspection data.

In this case, it is acceptable to have a configuration for the component setting means in which the component is placed on a transparent setting plate (for example, such as a glass plate, or transparent resin plate). If this is done, as well as being able to reduce costs by being able to form the component setting means at a low cost, it is possible to prevent the component setting means from entering the image and becoming material which obstructs the recognition of the component, and the component shape and so on can be recognized accurately.

Incidentally, it is possible to consider a configuration of one camera for the imaging device for imaging the pickup side and mounting side of the component respectively. In this case, it is acceptable to establish a dual optic system for bending and reflecting light by a bending and reflecting means such as a prism, mirror, and so on and inputting it into a camera; and, when taking an image of the component pickup side, blocking the optic path for the optic system for the component mounting side and taking an image of the component pickup side using the optic system for the component pickup side; and, when taking an image of the component mounting side, blocking the optic path for the optic system for the component pickup side and taking an image of the component mounting side using the optic system for the component mounting side. It is acceptable to have a separate lighting source for each of the dual optic systems.

Generally, the camera type for component mounters is different to the camera type for inspection machines (such as grayscale versus color, resolution, and lighting color). Considering this point, it is acceptable to have a configuration in which the imaging device has number one camera for imaging the component pickup side and number two camera for imaging the component mounting side. By doing this, it is possible to have a configuration in which number one camera for imaging the component pickup side uses the same type of camera as that of an inspection machine, and number two camera for imaging the component mounting side uses the same type of camera as that of a component mounter. Mounting data and inspection data can be made to conform to the various specifications and functions of the camera for the component mounter and the camera for the inspection machine.

It is acceptable to equip a lower side shielding plate which screens the background area in the component bottom side direction when taking an image of the component pickup side, and a top side shielding plate which screens the background area in the component top side direction when taking an image of the component mounting side, so that when imaging the component pickup side, the top side shielding plate is moved outside the imaging area, and when imaging the component mounting side, the lower side shielding plate is moved outside the imaging area. By doing this, along with items in the background on the opposite side such as lighting devices being prevented from being in the taken component image, by coloring each shielding plate with a color for easy component identification, there can be uniformity in the component background with a color for easy component identification and vision recognizing the component shape becomes easier.

In addition, when creating inspection data, it is acceptable to, along with taking an image of the board mounting surface, to extract an image of a component section from the image of the component pickup side taken by the imaging device, and to create inspection data by creating a composite by overlaying the image of the component section over the component mounting position in the image of the board mounting surface. By this, it is possible to easily create high accuracy inspection data based on a component image with the board as the background.

BRIEF DESCRIPTION OF DRAWINGS

FIG. 1 is an exterior perspective view of the mounting and inspection data creation device showing an embodiment of the present invention.

FIG. 2 is an exterior perspective view indicating the condition when imaging the component top side with the component set on the transparent setting plate.

FIG. 3 is a block diagram indicating the electrical configuration of the mounting and inspection data creation device.

FIG. 4 is a figure illustrating the creation method for inspection data for inspecting the component mounted on a board.

DESCRIPTION OF EMBODIMENTS

The following describes a specific embodiment for carrying out the present disclosure.

First, the configuration of mounting and inspection data creation device 11 is described using FIG. 1 and FIG. 2.

In the upper section of body frame 12 of mounting and inspection data creation device 11, number one camera 13 is assembled in a downward pointing direction, and in the lower section of the body frame 12, number two camera 14 is assembled in an upward pointing direction and the imaging positions of both cameras 13 and 14 are adjusted so that the optical axes (the center of the field of view) of both cameras 13 and 14 are aligned. Number one camera 13 and number two camera 14 are imaging devices for imaging component 15 which is the target for creating each of the data from the top side (picking side) and from the bottom side (mounting side), and number one camera 13 which images the top side of component 15 uses the same type of camera as that of an inspection machine camera (not shown in the figure), and number two camera 14 which images the bottom side of component 15 uses the same type of camera as that of a component camera (not shown in the figure) that images a component held on a suction nozzle of a component mounter from the bottom.

Lens 16 is assembled on the lower side of number one camera 13 and number one lighting device 17 is assembled below the lens 16. This number one lighting device 17 is configured so that the top side of component 15 is lit with the same type of lighting conditions as that of a lighting device (not shown in the figure) for an inspection machine. Top side shielding plate 18 that can slide in the horizontal direction which shades the background area for the upper direction in component 15 images when imaging the bottom side of component 15 with number two camera 14 is equipped on the lower side of number one lighting device 17. When imaging the top side of component 15 with number one camera 13, the top side shielding plate 18 is slid out of the number one camera 13 image area (field of view). As for sliding the top side shielding plate 18, it is acceptable for this to be performed manually by an operator and it is also acceptable for the top side shielding plate 18 to be slid by an actuator such as an air cylinder or motor. Top side shielding plate 18 is colored in a color that makes identifying component 15 easy (for example, blue).

On the other hand, lens 21 is assembled on the upper side of number two camera 14 and number two lighting device 22 is assembled above the lens 21. Number two lighting device 22 is configured so that the bottom side of component 15 is lit with the same type of lighting conditions as that of a lighting device (not shown in the figure) for a component camera in a component mounter. Lower side shielding plate 23, that can slide in the horizontal direction which shades the background area for the downward direction in component 15 images when imaging the top side of component 15 with number one camera 13, is equipped on the upper side of number two lighting device 22. When imaging the bottom side of component 15 with number two camera 14, the lower side shielding plate 23 is slid out of the number two camera 14 image area (field of view). As for sliding the lower side shielding plate 23, in the same manner as for top side shielding plate 18, it is acceptable for this to be performed manually by an operator and it is also acceptable for the lower side shielding plate 23 to be slid by an actuator such as an air cylinder or motor. Lower side shielding plate 23 is also colored in a color that makes identifying component 15 easy (for example, blue) in the same manner as for top side shielding plate 18.

As shown in FIG. 2, between top side shielding plate 18 and lower side shielding plate 23, there is positioned a transparent setting plate 25 (component setting means) on which component 15 that is the target for data creation is set, and this transparent setting plate 25 is maintained horizontally on support frame 26 which is fixed horizontally to body frame 12. Transparent setting plate 25 is formed from transparent material such as, for example, a glass plate or transparent resin plate, and via the open section for support frame 26 and transparent setting plate 25 the lower positioned number two camera 14 can image component 15 on transparent setting plate 25.

As shown in FIG. 3, the imaging signal output from number one camera 13 and number two camera 14 is transmitted to vision processing device 28. Vision processing device 28 is configured from a computer or the like, and input device 31 such as a keyboard, mouse, touch panel, or the like, and peripheral devices such as display device 32, and memory device 33, or the like are connected thereto. Vision processing device 28, along with functioning as a mounting data creation means to create mounting data based on the image of the bottom side of component 15 taken by number two camera 14, functions as an inspection data creation means to create inspection data based on the image of the top side of component 15 taken by number one camera 13.

Next, described is the mounting and inspection data creation method using the above configured mounting and inspection data creation device 11.

First, component 15 which is the target for creating data is loaded on the transparent setting plate 25 and set in a specific imaging position. Afterwards, the component 15 top side and bottom side are imaged in order. When doing this, it is also acceptable to image either the component 15 top side or bottom side first.

When imaging the top side of component 15, along with sliding lower side shielding plate 23 into the image area of number one camera 13 to shade the background area in the downward direction of component 15, top side shielding plate 18 is slid out of the image area of number one camera 13 to open the number one camera 13 image area. In this condition, number one lighting device 17 turns on and illuminates the top side of component 15 and the top side of component 15 is imaged by number one camera 13.

When imaging the bottom side of component 15, along with sliding top side shielding plate 18 into the image area of number two camera 14 to shade the background area in the upward direction of component 15, lower side shielding plate 23 is slid out of the image area of number two camera 14 to open the number two camera 14 image area. In this condition, number two lighting device 22 turns on and illuminates the bottom side of component 15 and the bottom side of component 15 is imaged by number two camera 14.

The images of the top side and bottom side of component 15 taken by number one camera 13 and number two camera 14 are transmitted to vision processing device 28. Vision processing device 28 creates mounting data based on the component 15 bottom side image taken by number two camera 14, and creates inspection data based on the component 15 top side image taken by number one camera 13.

When creating inspection data, information which cannot be assumed from the image of the bottom side of component 15 is obtained from the image of the top side of component 15. For example, when there are characters on the top of component 15, such as codes for the rated voltage and/or capacity, it is also acceptable to create optical character recognition data in order to recognize these characters and check the component type. In addition, when a polarity mark is displayed on top of component 15, it is also acceptable to create polarity inspection data to recognize the polarity mark and inspect component 15 polarity. For components that have polarity, there are components for which it is not possible to determine the polarity from the image of the bottom side of the component, but when a polarity mark is displayed on the top side of the component, by using the image of the component top side, it is possible to create polarity inspection data for recognizing the polarity mark on the top side of the component and inspecting component polarity.

When creating inspection data for inspecting the board component mounting condition, a board image (refer to FIG. 4) taken of the mounting surface of the board is acquired and displayed in the screen of display device 32. Here, for the board image, it is also acceptable to use a board image taken by number one camera 13 of mounting and inspection data creation device 11, and it is also acceptable to use a board image taken by a camera equipped in some other machine such as a component mounter and screen printer.

The image of the top side of component 15 taken by number one camera 13 is displayed in the screen of display device 32, and the appropriate component section of the image is clipped (extracted). And, on the screen of display device 32, the clipped component section image is overlaid at the applicable component mounting position in the image of the mounting surface of the board and a composite is created with component 15 terminals positioned overlaying the board lands to create inspection data. By this, it is possible to easily create high accuracy inspection data based on a component image with the board as the background.

In addition, if a composite of all the components to mount on the board is made, it is possible to create a completed sample of a board on which components are mounted during production. By doing this, it is possible to perform inspection of the mounting sequence coordinates before production.

According to the embodiment of mounting and inspection data creation device 11 described above, because the device is configured such that component 15 which is the target for creating data is set on the transparent setting plate 25 and both the top side and bottom side of the applicable component 15 can be imaged, mounting data and inspection data can both be created efficiently by a single mounting and inspection data creation device 11.

Further, because component 15 which is the target for data creation is set in a condition on the transparent setting plate 25 in which it is possible to image both the top side and bottom side, the component 15 does not have to be moved between taking images of the top side and bottom side of component 15, and it is possible to eliminate operation mistakes such as component position deviations between the two images of component 15, component 15 direction (polarity) mistakes, and imaging the wrong component 15. By this, creating incorrect data can be prevented, and the reliability and accuracy of the mounting and inspection data can be improved.

Incidentally, when creating mounting data and inspection data from each image of the component 15 bottom side and top side, it is necessary to specify the component center position for each image. If there is a deviation in the part center for the two images, component deviation inspection cannot be performed accurately.

For this point, for this embodiment, because an image of top side and an image of the bottom side of component 15 can be taken without moving the component 15, and the two camera 13 and 14 positions are determined beforehand, it is possible to set the same coordinates for the component center in the images for the bottom side and top side of component 15. By this, if the component center position is specified in one image, the component center position in the other image is automatically determined, and it is possible to create accurate mounting data and inspection data.

In addition, for this embodiment, because transparent setting plate 25 is used as the component setting means to set component 15, it possible to form the component setting means at a low cost, and in addition to being able to lower costs, it is possible to prevent the component setting means from entering the image and becoming material which obstructs the recognition of component 15, and the component shape and so on can be recognized accurately.

Generally, the camera type for component mounters is different to the camera type for inspection machines (such as grayscale versus color, resolution, and lighting color). Considering this point, for this embodiment, because the imaging device for imaging the top side and bottom side of component 15 is configured with a number one camera 13 for imaging the top side of component 15 and a number two camera 14 for imaging the bottom side of component 15, it is possible to make a configuration in which the number one camera 13 for imaging the top side of the component 15 uses the same type of camera as that of an inspection machine, and the number two camera 14 for imaging the component 15 bottom side uses the same type of camera as that of a component mounter, and mounting data and inspection data can be made conforming to the various specifications and functions of the camera for the component mounter and the camera for the inspection machine.

However, it is also acceptable for the imaging devices for imaging the component top side and bottom side respectively to be comprised of one camera. In this case, it is acceptable to establish a dual optic system for bending and reflecting light by a bending and reflecting means such as a prism, mirror, and so on and inputting it into a camera; and, when taking an image of the top side of the component, blocking the optic path for the optic system for the bottom side of the component and taking an image of the top side of the component using the optic system for the top side of the component; and, when taking an image of the bottom side of the component, blocking the optic path for the optic system for the top side of the component and taking an image of the bottom side of the component using the optic system for the bottom side of the component. It is acceptable to have a separate lighting source for each of the dual optic systems.

Further, for this embodiment, because there is equipped a lower side shielding plate 23, which screens the background area in the component 15 top side direction when taking an image of the component 15 bottom side, and a top side shielding plate 18, which screens the background area in the component 15 top side direction when taking an image of the component 15 bottom side, so that when imaging the component 15 top side, the top side shielding plate 18 is moved outside the imaging area, and when imaging the component 15 bottom side, the lower side shielding plate 23 is moved outside the imaging area, along with items in the component 15 background on the opposite side such as lighting devices 17 or 22 being prevented from being in the taken component 15 image, by coloring each shielding plate 18 and 23 with a color for easy component 15 identification, there can be uniformity in the component 15 background with a color for easy component 15 identification and vision recognizing the component shape becomes easier.

Further, for this embodiment, the optical axes of both number one camera 13 and number two camera 14 that are in the top and lower sections of body frame 12 for the mounting and inspection data creation device 11 are aligned, but it is also acceptable to make suitable changes to the positions of number one camera 13 and/or number two camera 14 using an optic system for inputting reflected/bent light by reflection/light bending means such as prisms, mirrors and so on.

In addition, for this embodiment, component 15 is set on transparent setting plate 25 so the top side is the pickup side and the bottom side is the mounting side, but it is also acceptable for this to be reversed so that component 15 is set on transparent setting plate 25 with the top side as the mounting side and the bottom side as the pickup side, and mounting data is created based on the image of the mounting side (top side) of component 15 taken by number one camera 13, and inspection data is created based on the image of the pickup side (bottom side) of component 15 taken by number two camera 14.

In addition, various embodiments with changes that do not extend beyond the scope of the invention are possible such an additional device that adjusts the lighting conditions for number one lighting device 17 to the lighting conditions used for inspection machine, and an additional device that adjusts the lighting conditions for number two lighting device 22 to the lighting conditions of component mounter cameras.

REFERENCE NUMBER LIST

11: mounting and inspection data creation device, 12: body frame, 13: number one camera (imaging device), 14: number two camera (imaging device), 15: component, 16: lens, 17: number one lighting device, 18: top side shielding plate, 21: lens, 22: number two lighting device, 23: lower side shielding plate, 25: transparent setting plate (component setting means), 26: support frame, 28: vision processing device (mounting data creation means, inspection data creation means), 31: input device, 32: display device

What is claimed is:
1. A mounting and inspection data creation device for creating mounting data used by a vision processing device of a component mounter for components which are supplied by a component supply device being held on suction nozzles to be mounted on a board, and for creating inspection data used by a vision processing device of an inspection machine to inspect the mounted component on the board, comprising:

a transparent component setting holder which sets a component which is a target for data creation in a state in which both a pickup side and a mounting side of the component are imaged, a first camera which takes images of the pickup side of the component set in the transparent component setting holder, and a second camera which takes images of the mounting side of the component set in the transparent setting holder, a lower side shielding plate which moves in a horizontal direction and screens a background area in a component bottom side direction when taking an image of the pickup side of the component, a top side shielding plate which moves in the horizontal direction and screens a background area in a component top side direction when taking an image of the mounting side of the component, and circuitry configured to create the mounting data based on the image of the mounting side of the component taken by the second camera, and create the inspection data based on the image of the pickup side of the component by the first camera.

2. The mounting and inspection data creation device according to claim 1, wherein the lower side shielding plate and the top side shielding plate move so that when imaging the pickup side of the component, the top side shielding plate is moved outside an imaging area, and when imaging the mounting side of the component, the lower side shielding plate is moved outside the imaging area.

3. The mounting and inspection data creation device according to claim 1, wherein the circuitry is further configured to extract an image of a component section from the image of the pickup side of the component taken by the first camera, and create the inspection data by creating a composite by overlaying the image of the component section over a component mounting position in the image of the board mounting surface.

4. A mounting and inspection data creation method for creating mounting data used by a vision processing device of a component mounter which picks up components supplied by a component supply device using suction nozzles and mounts the components on a board, and for creating inspection data used by a vision processing device of an inspection machine to inspect the components mounted on the board, the method comprising:

setting a component which is a target for data creation on a transparent holder in a manner in which both a pickup side and a mounting side of the component are imaged, providing a lower side shielding plate which moves and screens a background area in a component bottom side direction when taking an image of the pickup side of the component, providing a top side shielding plate which moves and screens a background area in a component top side direction when taking an image of the mounting side of the component, taking the image of the pickup side of the component, taking the image of the mounting side of the component, after the images of the pickup side and mounting side of the component are taken, creating the mounting data based on the image of the mounting side of the component, and creating the inspection data based on the image of the pickup side of the component, wherein, when the image of the pickup side of the component is taken, the top side shielding plate is moved outside an imaging area, and, when the image of the mounting side of the component is taken, the lower side shielding plate is moved outside the imaging area.

5. The mounting and inspection data creation device according to claim 1, wherein the transparent component setting holder is a transparent plate.

* * * * *